US006984884B2

(12) United States Patent
Kikuchi et al.

(10) Patent No.: US 6,984,884 B2
(45) Date of Patent: Jan. 10, 2006

(54) ELECTRIC POWER SEMICONDUCTOR DEVICE

(75) Inventors: Masao Kikuchi, Tokyo (JP); Dai Nakajima, Tokyo (JP); Koichi Tsurusako, Fukuoka (JP); Kunihiro Yoshihara, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/836,262

(22) Filed: May 3, 2004

(65) Prior Publication Data

US 2004/0251528 A1 Dec. 16, 2004

(30) Foreign Application Priority Data

Jun. 11, 2003 (JP) ............................ 2003-166058

(51) Int. Cl.
*H01L 23/48* (2006.01)

(52) U.S. Cl. ...................... 257/693; 257/674; 257/668; 257/694; 257/695; 257/696

(58) Field of Classification Search ................ 257/678, 257/674, 688, 693–696
See application file for complete search history.

(56) References Cited

U.S. PATENT DOCUMENTS 4,862,246 A * 8/1989 Masuda et al. ............. 257/666
4,894,704 A * 1/1990 Endo .......................... 257/667
4,987,474 A * 1/1991 Yasuhara et al. ........... 257/666
5,554,885 A * 9/1996 Yamasaki et al. ........... 257/666
6,340,840 B1 * 1/2002 Ohsawa et al. ............. 257/672
6,459,147 B1 * 10/2002 Crowley et al. ............ 257/692
6,630,726 B1 * 10/2003 Crowley et al. ............ 257/666
6,657,298 B1 * 12/2003 Glenn ........................ 257/730

FOREIGN PATENT DOCUMENTS

| | | | |
|---|---|---|---|
| JP | 58-147141 | | 9/1983 |
| JP | 61-144650 | | 9/1986 |
| JP | 63181363 A | * | 7/1988 |
| JP | 3-71652 | | 7/1991 |
| JP | 6-21315 | | 1/1994 |
| JP | 06232317 A | * | 8/1994 |
| JP | 11-238843 | | 8/1999 |
| JP | 2002026221 A | * | 1/2002 |

* cited by examiner

*Primary Examiner*—Tom Thomas
*Assistant Examiner*—Chris C. Chu
(74) *Attorney, Agent, or Firm*—Oblon, Spivak, McClelland, Maier & Neustadt, P.C.

(57) ABSTRACT

A main lead (2) is a single body comprised of an inner lead (2*a*) and an outer lead (2*b*) which are integrally formed, the bonding wires are arranged in parallel and fixed onto the inner lead (2*a*) by the wire bonding portions (3*b*), and the outer lead are exposed from the mold resin to the outside for electrical connection, and a plurality of through holes (8) penetrating the main terminal lead are formed in the outer vicinity of the wire bonding portions (3*b*) within the inner lead (2*a*), and the through holes are arranged substantially in parallel to the arrangement direction of the wire bonding portions (3*b*) so as to correspond to the entire wire bonding portions (3*b*).

10 Claims, 8 Drawing Sheets

ELECTRIC POWER SEMICONDUCTOR DEVICE

BACKGROUND OF THE INVENTION

1. Field of the Invention

The present invention generally relates to an electric power semiconductor device for controlling a large amount of current, and more particularly, relates to an electric power semiconductor device in which an electric power semiconductor element and an inner lead are connected in pair with a plurality of bonding wires.

2. Description of the Related Art

Conventionally, in an electric power semiconductor device sealed with a mold resin, a main terminal (also referred to as "lead" or "lead frame", hereinafter) is provided for drawing a main current from a semiconductor element such as an IC chip. The main tenninal is integrally formed of an inner lead and an outer lead, and the main terminal is screwed to an external substrate or a wiring part such as a bus bar at the external lead. Thus, the main current is controlled based on a gate voltage applied to a gate terminal from an external control circuit. In this conventional construction, the bonding wires for electrically connecting the electric power semiconductor element are formed of a plural aluminum wires each having a diameter of 100 to 500 μm, and the plurality of bonding wires are arranged to be connected to the same lead to ensure a current amount.

In a general construction of a semiconductor device such as a package sealed with a mold resin, the physical properties such as a linear expansion coefficient and Young's modulus of the mold resin is different from those of the lead frame of a metal material. Therefore, a shearing force acts on an interface between the mold resin and the lead frame through thermal cycles. In a case where the semiconductor device has a large mold resin part and requires long-time reliability, when the shearing force acts on the interface between the mold resin and the main lead terminal, a separation or abrasion may occur between these members. Especially, when the separation occurs in the vicinity of the wire bonding portion, the wire bonding portion is cracked. As a result, the wire per se may be broken.

As an effective constitution to prevent the separation at the interface, in a semiconductor device disclosed in, for example, a patent document 1, in order to ensure bondingability of the bonding wire, a plated film is formed on a post part which serves as a fixing portion of a bonding wire, and a through hole is formed so as to penetrate the plated film at the post part of an inner lead to which the bonding wire is fixed.

In this semiconductor device, since the through hole is formed in the plated film, an area of the interface between the plated film having primarily low adhesiveness with a resin and the mold resin can be reduced, so that the separation in the interface is reduced. The separation preventing structure as disclosed in the patent document 1 is effective for the semiconductor device having a structure of LOC (Lead On Chip) and the like, in which a driving current is small and a bonding wire having a diameter of about 50 μm or less is used at the post part having a minute area.

[Patent Document 1]

Unexamined Japanese Patent Laid-open Publication No. 11-238843 (see paragraphs 0017 to 0023, FIG. 1 and FIG. 4)

However, a large amount of driving current is necessarily used in an electric power semiconductor device, and metal wires each having a diameter of 100 to 500 μm are generally used as the bonding wires, and it is necessary to fix the plural number of bonding wires to one inner lead. Therefore, when the above conventional constitution is used, there arises a problem that a capacity for current density of the lead is limited because of formation of the through hole. Thus, there has been increased a demand for further improvement regarding the configuration and the arrangement of the through hole.

Moreover, in order to allow a large amount of current to be used in the electric power semiconductor device, there is employed a method fixing a bonding wire having a large diameter for the semiconductor device by applying high supersonic energy thereto. Therefore, high rigidity and preferable restraint are required for a member which fixes the bonding wire on the inner lead. When the rigidity is low and the binding force is not sufficient in the fixing portion, the fixing portion resonates with the supersonic vibration at the time of fixing, and therefore the supersonic energy could not be efficiently applied to the fixing portion to be a problem.

Especially, referring to the inner lead, it is necessary to reduce a thickness of the lead plate because of a process for forming its configuration and in view of demand for miniaturization. Moreover, when the inner lead is fixed by applying only upward and downward force, the bonding force in the surface direction becomes insufficient, to be a problem in view of manufacture and stability thereof.

SUMMARY OF THE INVENTION

The present invention has made in order to solve the above problems, and the inventors of the present invention have found that, when through holes formed in a main terminal are preferably arranged, a mold resin is restrained by the through holes so that the separation caused at the interface does not proceed from the through hole toward the central portion of the semiconductor device.

Furthermore, the present invention has been completed on the basis of knowledge that when the vicinity of the fixing portion of the bonding wire is surely bound in the direction of the supersonic vibration by forming the through holes in the main terminal, the stability at the time of bonding is considerably improved.

Therefore, it is an object of the present invention to provide an electric power semiconductor device in which even when separation is generated from an outer peripheral end face of a mold resin toward the inside of a main terminal, the separation can be prevented from proceeding toward the inside, and the separation and fracture of the bonding wires can be surely prevented at a portion of forming the wire bonding portion and in its vicinity, achieving a high reliability with reduction in size.

In order to attain the above object, an electric power semiconductor device includes: a semiconductor element mounted on a die pad; a main terminal lead electrically connected to the semiconductor element by a plurality of bonding wires; and a mold resin for sealing the semiconductor element, bonding wires, and wire bonding portions of the bonding wires on the main terminal lead, thereby forming a package thereof.

The main terminal lead is a single body comprised of an inner lead and an outer lead which are integrally formed with each other. The bonding wires are arranged in parallel and fixed onto the inner lead by the wire bonding portions, and the outer lead are exposed from the mold resin to the outside for electrical connection.

A plurality of through holes penetrating the main terminal lead are formed in the outer vicinity of the wire bonding portions within the inner lead, and the through holes are arranged substantially in parallel to the arrangement direction of the wire bonding portions so as to correspond to the entire part of the wire bonding portions. As a result, resin separation is prevented and wire bonding ability can be improved.

BRIEF DESCRIPTION OF THE DRAWINGS

These and other objects and features of the present invention will be readily understood from the following detailed description taken in conjunction with preferred embodiments thereof with reference to the accompanying drawings, in which like parts are designated by like reference numerals and in which:

FIGS. 4A and 4B are explanatory views comparing separation occurrence in a thermal cycle test, in which FIG. 4A shows a case of a conventional constitution and FIG. 4B shows a case according to the embodiment of the present invention;

DETAILED DESCRIPTION OF THE PREFERRED EMBODIMENTS

Figure 1:
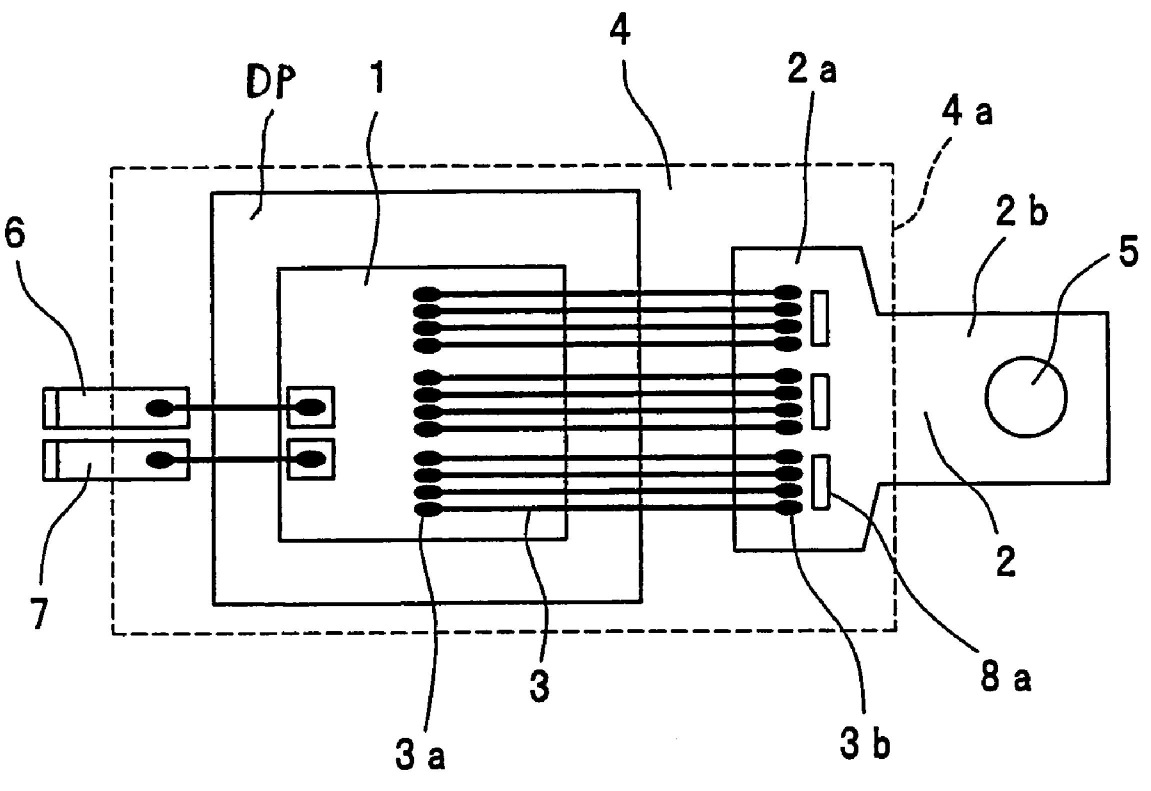
FIG. 1 is a partially perspective top view showing an electric power semiconductor device seeing through a mold resin part according to an embodiment 1 of the present invention.

Before the description proceeds, it is to be noted that, since the basic structures of the preferred embodiments are in common, like parts are designated by the same reference numerals throughout the accompanying drawings.

In a basic configuration of an electric power semiconductor device according to the present invention, a main terminal lead is a single body comprised of an inner lead portion and an outer lead portion which are integrally formed. The inner lead portion are fixed with the bonding wires by the wire bonding portions, and the outer lead portion is provided for external connection and is exposedly extended from a mold resin to the outside. The plurality of bonding wires are fixed in parallel onto the inner lead portion, and a plurality of through holes penetrating the main terminal lead are formed in the outer vicinity of the wire bonding portions. Thus, the through holes correspond to the entire wire bonding portions of the bonding wires within the inner lead so as to be almost parallel to the arrangement direction of the wire bonding portions.

[Embodiment 1]

FIG. 1 is a top view showing an electric power semiconductor device according to an embodiment 1 of the present invention, which is partially perspective by seeing through a mold resin part. In FIG. 1, reference numeral 1 designates an electric power semiconductor element such as an IC chip which is mounted on a die pad (DP). Reference numeral 2 designates a main terminal (lead) for drawing a main current from the electric power semiconductor element 1, which includes an inner lead 2*a* and an outer lead 2*b* which are integrally formed with each other. Reference numeral 3 designates a bonding wire for electrically connecting between the electric power semiconductor element 1 and the inner lead 2*a* of the main terminal 2. Reference numeral 4 designates a mold resin for sealing the electric power semiconductor element 1 and the inner lead 2*a* connected by the bonding wire 3 and the like.

In the main terminal 2, a hole 5 is formed almost in the central portion of the outer lead 2*b* for screwing the main terminal to an external substrate (not shown) or a wiring part such as a bus bar. It is noted here that the outer lead portion of the main terminal may be connected to an external substrate by a soldering method instead of using a screw and the like. Reference numeral 6 designates a gate terminal, and the electric power semiconductor element 1 controls the main current based on a control voltage (a gate voltage) applied to a gate from an external control circuit through the gate terminal 6. Reference numeral 7 designates a sense terminal which is provided for a protecting function preventing an overcurrent or the like of the semiconductor device.

A plurality of bonding wires 3 are arranged on the same terminal lead to electrically connect the electric power semiconductor element 1 thereto, and each of the bonding wires has a diameter of 100 to 500 $\mu$m and is made of a metal material such as aluminum, copper, gold or the like, thereby ensuring a large amount of current for use in the power semiconductor device.

One end of each bonding wire 3 has an element side bonding portion 3*a* which is fixed onto the electric power semiconductor element side 1, and the other end of each bonding wire 3 has a lead side bonding portion 3*b* which is fixed onto the inner lead 2*a*.

In addition, one or more rectangular elongated through holes 8*a* penetrating the main terminal lead 2 are formed in the vicinity of the lead side bonding portions 3*b* within the inner lead 2*a*, and the through holes 8*a* are positioned between the lead side bonding portions 3*b* and an outer peripheral end face 4*a* of the mold resin 4.

The through holes 8*a* are arranged in the direction almost parallel to the arrangement direction of the lead side bonding portions 3*b*. That is, the longitudinal direction of the through holes 8*a* is almost perpendicular to the extending direction of the bonding wires 3. Thus, the through holes 8*a* are contained within a sealing region of the mold resin 4, so that good stability in constitution of the main terminal can be attained.

Figure 2:
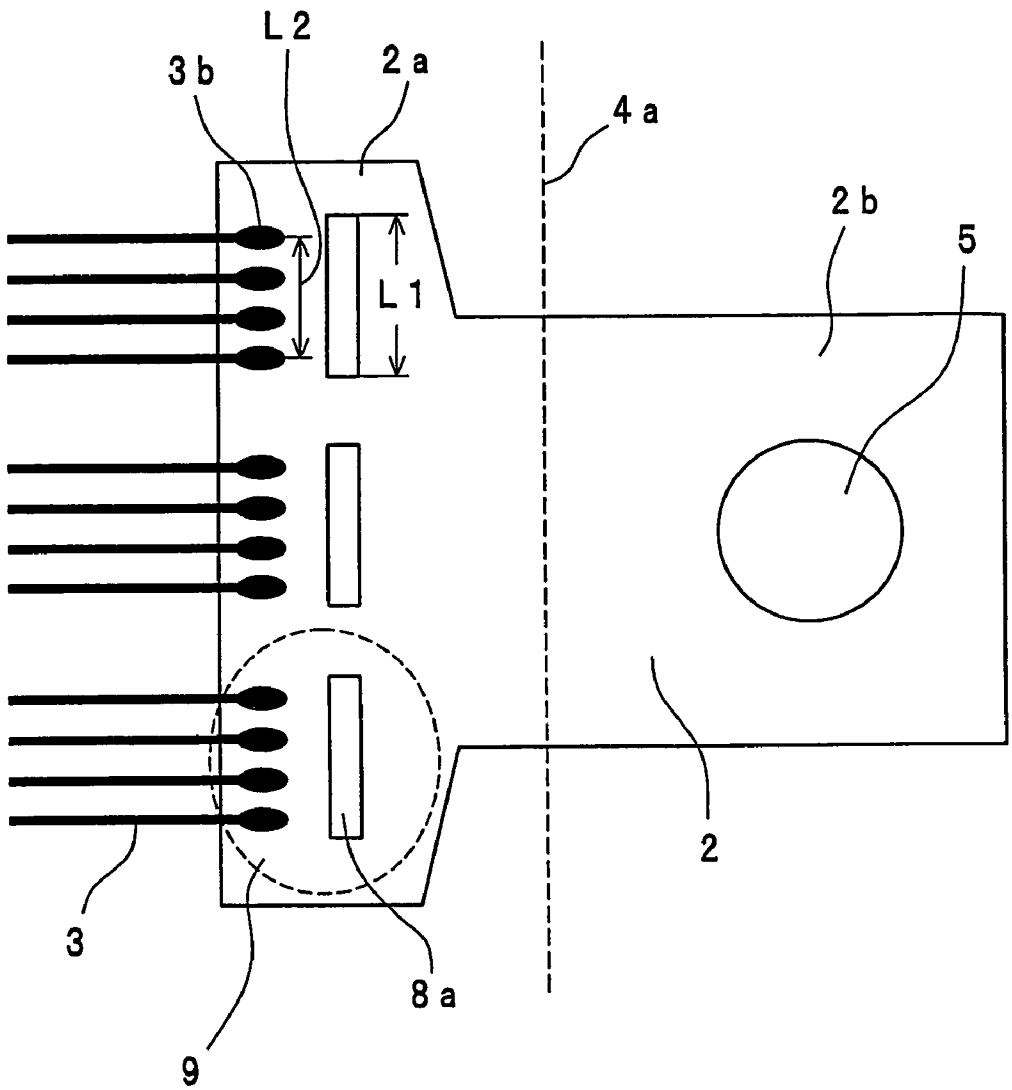
FIG. 2 is an enlarged top view showing a main terminal lead part in FIG. 1.

FIG. 2 is an enlarged top view showing the inner lead portion 2*a* of the main terminal 2. Referring to FIG. 2, an arrangement relation between the lead side bonding portions 3*b* of the bonding wires 3 positioned on the inner lead 2*a* and the through holes 8*a* provided in the main terminal lead portion.

One through hole 8*a* is formed so as to correspond to a predetermined number of the bonding wires 3, in the vicinity of the plural lead side bonding portions 3*b* within the outer peripheral end face 4*a* of the mold resin 4. A set of one through hole 8*a* and a predetermined number of corresponding lead side bonding portions 3*b* is designated by a broken line region 9, and one or plural sets 9 thereof are formed in the inner lead 2*a* corresponding to the whole number of the bonding wires 3.

According to the example shown in FIG. 2, three sets of the through holes 8*a* and the corresponding bonding portions 3*b* are formed. In this example, a longitudinal length L1 of the through hole 8*a* is made equal to or slightly larger than a length L2 in width of the arrangement direction of the predetermined number of the bonding portions 3*b* in each set 9.

Figure 3:
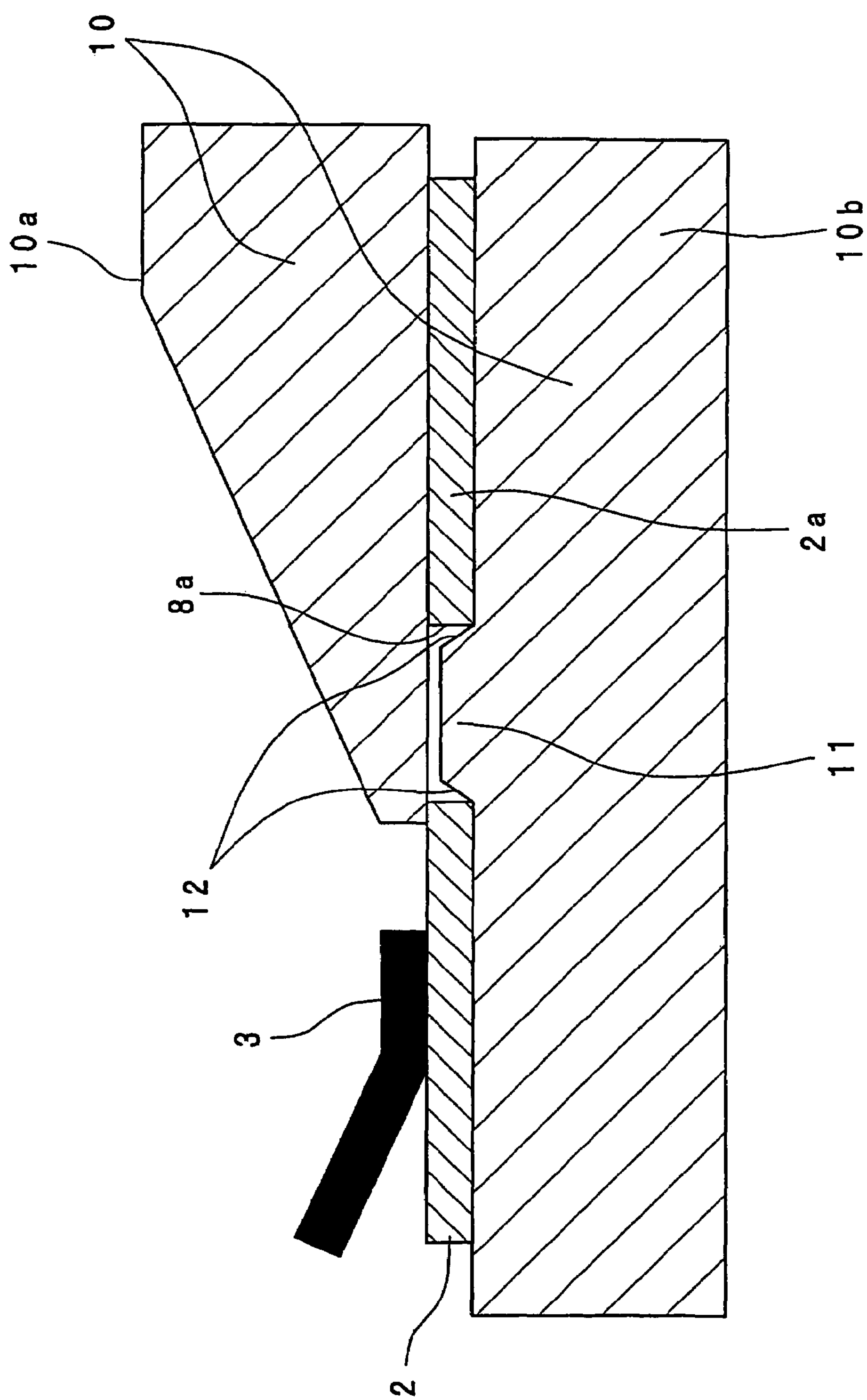
FIG. 3 is a sectional view showing an essential part of the semiconductor device for explaining a constitution in which a bonding wire is fixed to a main terminal, according to the embodiment 1 of the present invention.

FIG. 3 is a sectional view showing an essential part of the power semiconductor device for explaining a process of fixing the bonding wire 3 onto the inner lead of the main terminal 2 according to the embodiment 1 of the present invention. At the time of wire bonding process, the main terminal 2 is fixed by pressure by applying upward and downward pressure forces thereto. In specific, the wire bonding is performed by a metal bonding method in which supersonic vibration is applied to the bonding wire 3 to be rubbed on a surface of the main terminal lead to be bonded, and a plastic flow is generated by induced mechanical energy and thermal energy to thereby promote removal of a surface oxide and exposure of a new-sprung surface. The supersonic vibration is applied in the direction parallel to the surface of the main terminal 2. Therefore, if the main terminal 2 is not sufficiently pressurized by the upward and downward forces, the main terminal 2 resonates with the supersonic vibration. As a result, the bonding of the wires is insufficiently made and the wires may be excessively displaced and damaged.

Therefore, in the present embodiment as shown in FIG. 3, the through hole 8*a* is formed in an extension region of the bonding wire 3 in the vicinity of the lead side bonding portion 3*b* in the main terminal 2, and the main terminal 2 is pressurized and fixed by applying the upward and downward forces thereto using a jig 10 including an upper jig 10*a* and a lower jig 10*b*. In this construction, the main terminal 2 is also fixed in the surface direction by inserting a fixing projection 11 to the through hole 8*a*, where the fixing projection 11 is formed to project from the predetermined portion of an upper surface of the lower jig 10*b*.

Thus, the displacement in the direction of the supersonic vibration can be restrained by pressure contacting part 12 formed between a peripheral side wall of the fixing projection 11 and a side wall of the through hole 8*a*. Accordingly, the bonding wire 3 and the main terminal 2 are relatively displaced in an efficient manner so that a preferable bonding ability can be attained.

As described above, according to the present embodiment, the screwed portion in the main terminal and the fixing portion of a signal terminal to a substrate work as regulating portions to restrain distortions generated in a shearing direction between the mold resin and the main terminal surface in the vicinity of the wire bonding portions when thermal cycles are applied, and thus the boundary separation of the mold resin in the interface portion can be prevented.

Figure 4A:
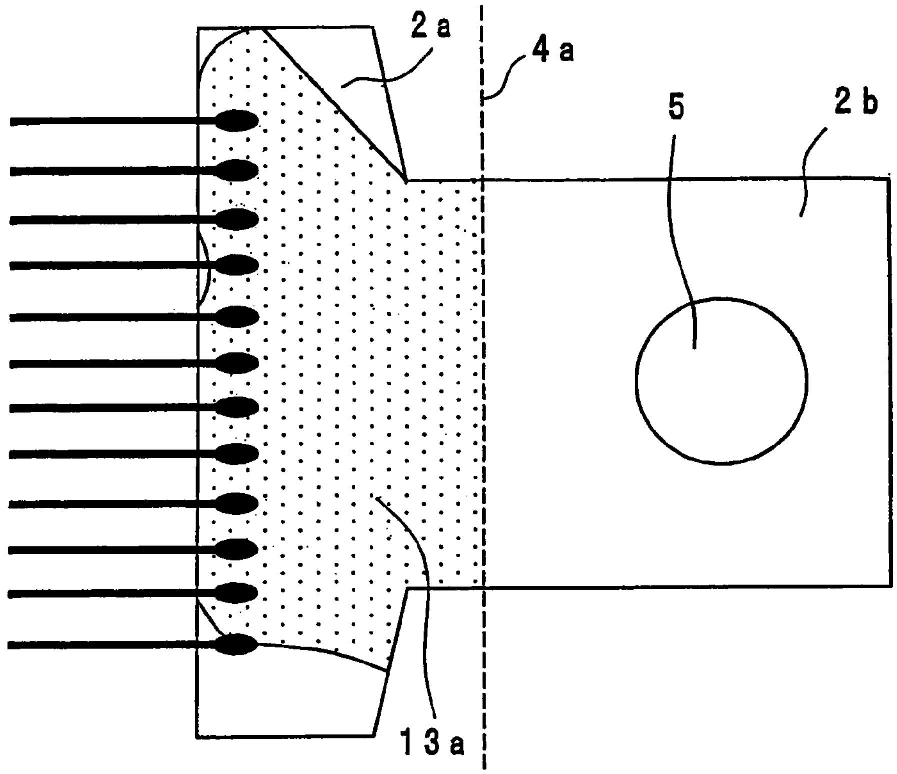
Figure 4B:
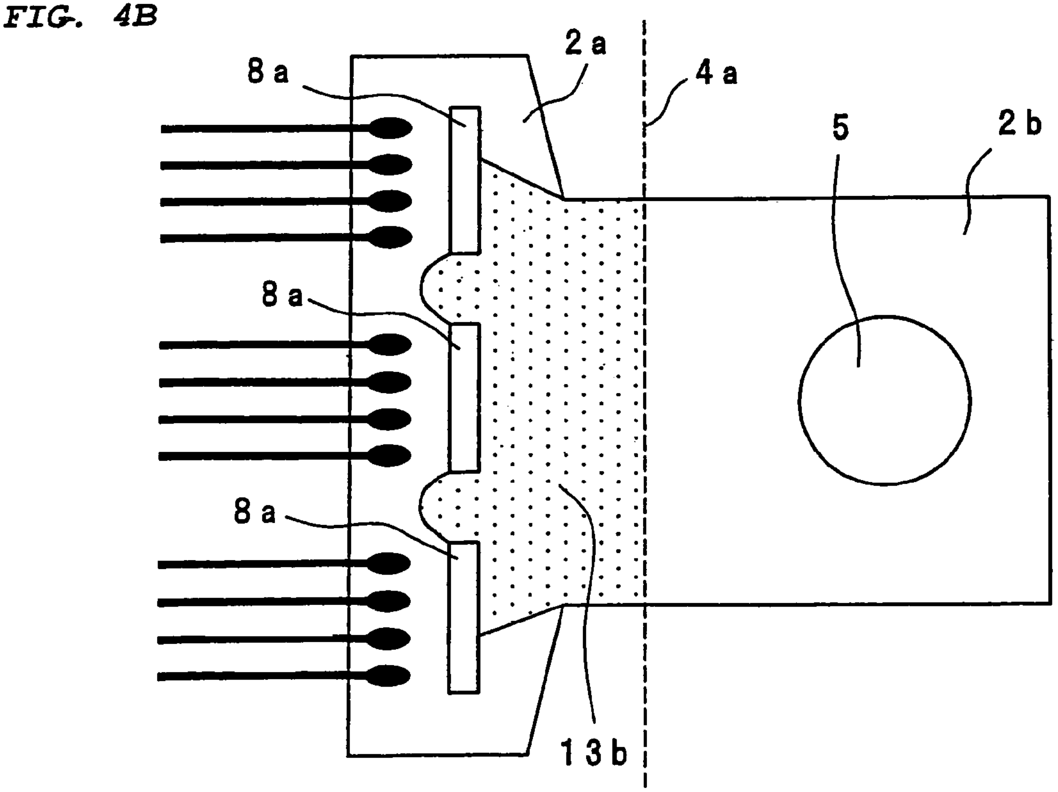

FIGS. 4A and 4B are views showing a compared result of separation occurrence in a thermal cycle test which was performed in temperature change from −40° C. to 125° C. in 1000 cycles between the constitution according to this embodiment and the conventional constitution, in which FIG. 4A shows the conventional case in which no through hole is formed and FIG. 4B shows the case of this embodiment in which thorough holes are formed.

In the conventional constitution in which there is no through hole as shown in FIG. 4A, a mold resin separation region 13*a* on the main terminal surface spreads almost all over the surface of the inner lead 2*a* including the region where the wire bonding portions 3*b* are formed, and there occurred a fracture in the bonding wire at the bonding portion.

Meanwhile, according to the present embodiment in which the through holes 8*a* are formed as shown in FIG. 4B, although a separation region 13*b* is generated from the outer peripheral end face 4*a* of the mold resin toward the inside of the main terminal, the separation was prevented from proceeding to the inside of the through hole 8*a*. Thus, the separation can be surely prevented from occurring in the region where the bonding portions 3*b* are formed and its vicinity, so that there occurred no fracture in the bonding wires.

Especially, since the length L1 of the through hole in the longitudinal direction is made to be equal to or longer than the width L2 of each set of the wire bonding portions 3*b* as shown in FIG. 2, the separation can be surely prevented from proceeding to the bonding portions.

According to the above constitution, the parts of the main terminal portion between the through holes may be formed by requisite minimum areas without damaging balance of a current flowing path from each bonding wire to a bonding portion, and reaching the outer lead through the inner lead. As a result, the semiconductor device can be reduced in size.

Figure 5:
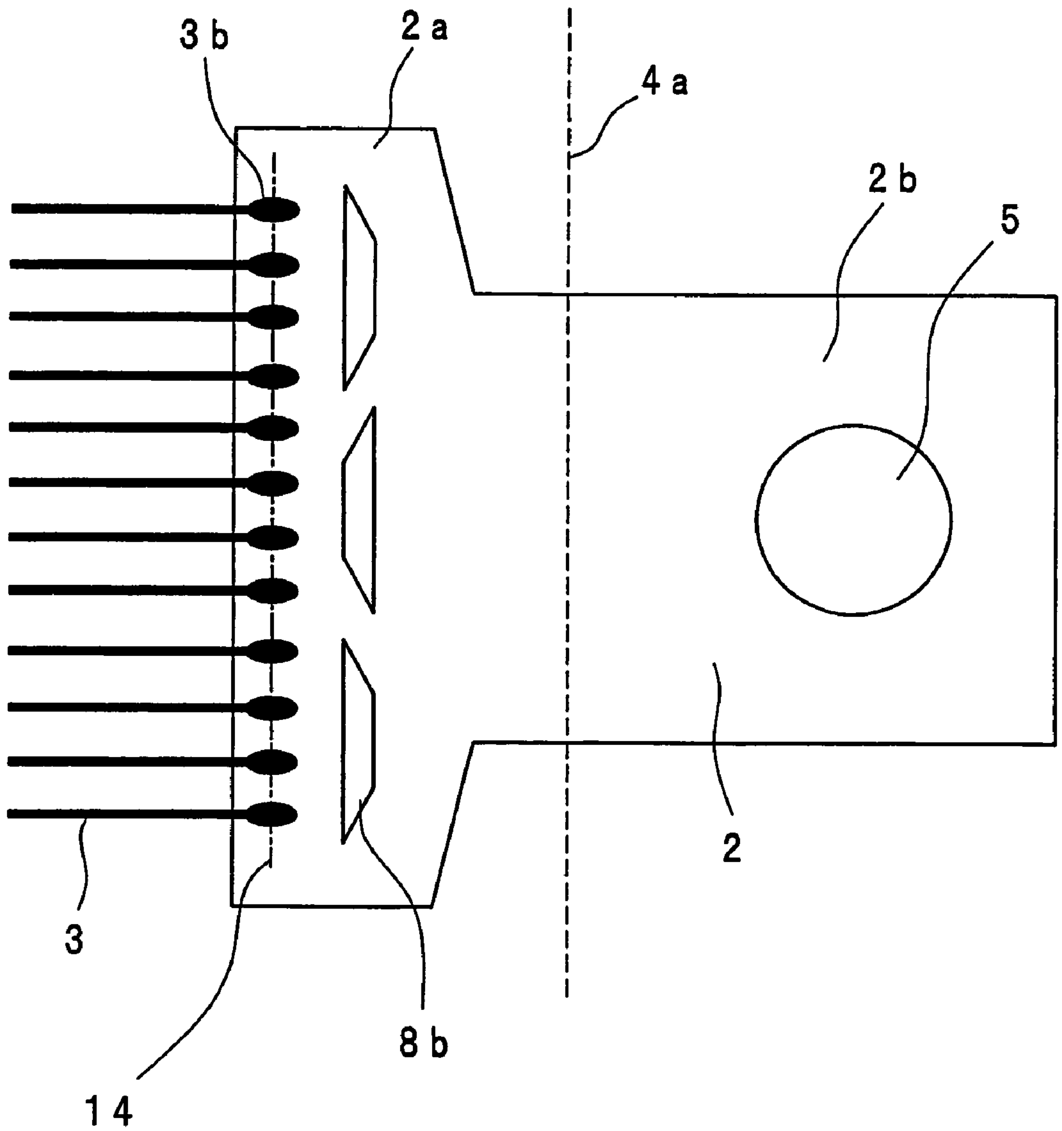
FIG. 5 is an enlarged top view showing an essential part of a modified example of the embodiment 1 shown in FIG. 2.

FIG. 5 is a view showing a modified example of the embodiment 1 shown in FIG. 2, in which a configuration of a through hole 8*b* formed in the inner lead 2*a* of the main terminal 2 is different from that of the through hole 8*a* shown in FIG. 2. Specifically, trapezoidal through holes 8*b* are arranged so as to be symmetrical mutually.

Referring to FIG. 5, the plural through holes 8*b* are arranged on the outside in the vicinity of the bonding portions 3*b*, along a phantom line 14 connecting the bonding portions 3*b* in the arrangement direction, and the through holes 8*b* are formed such that the projected portions of the through holes to the phantom line 14 are closely arranged leaving no space between the adjacent through holes. The bonding portions 3*b* are arranged at almost the same intervals regardless of the positions with respect to the through holes 8*b*. Thus, since the through holes are surely provided between the bonding portions 3*b* and the mold resin outer peripheral end face 4*a*, the bonding portions can be closely arranged, so that the semiconductor device can be further reduced in size.

[Embodiment 2]

Figure 6:
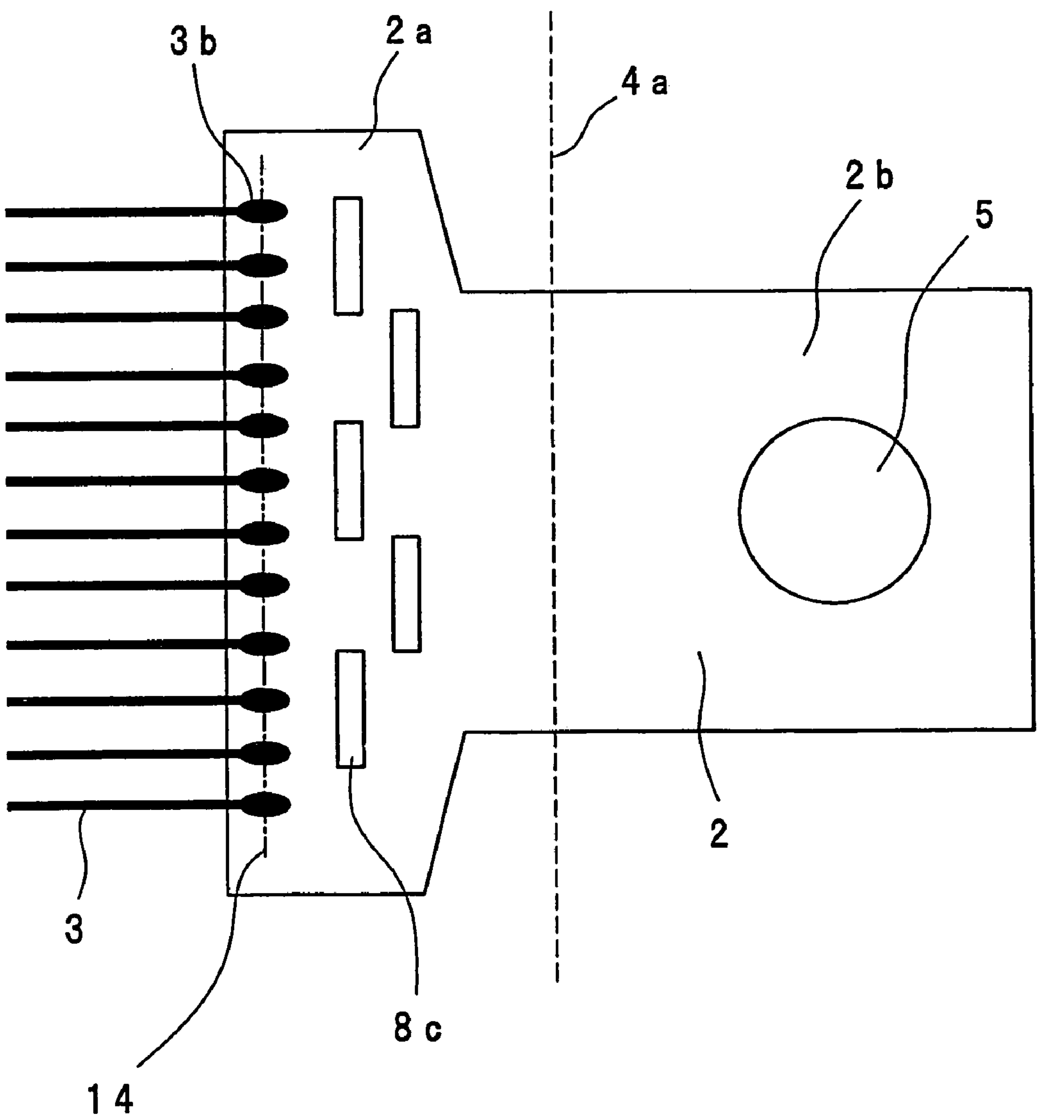
FIG. 6 is an enlarged top view showing an inner lead part of an electric power semiconductor device according to an embodiment 2 of the present invention.

FIG. 6 is an enlarged top view showing an inner lead portion of an electric power semiconductor device according to an embodiment 2 of the present invention. As shown in FIG. 6, a plurality of through holes 8*c* are formed in two rows along the phantom line 14 connecting the bonding portions 3*b* in the arrangement direction. The through holes 8*c* are arranged in a shape of a zigzag at predetermined intervals and shifted with each other at almost the same intervals.

According to the through holes 8*c* arranged in this zigzag manner, since the projected portions of the through holes 8*c* to the phantom line 14 are closely arranged, leaving no space between the adjacent through holes, the bonding portions 3*b* can be arranged at almost the same intervals regardless of the positions with respect to the through holes 8*c*.

Thus, a given large amount of current can be ensured by the main terminal regions between the through holes arranged in zigzag, and the bonding portions 3*b* can be further closely arranged. As a result, the semiconductor device can be further reduced in size while the separation of the mold resin in the vicinity of the bonding portions can be prevented.

It is noted here that, although the configuration of each of the through holes 8*c* is rectangular in this embodiment, they may be trapezoidal through holes arranged symmetrically to each other as shown in FIG. 5. Thus, since the through holes surely exist between the bonding portion 3*b* and the mold resin outer peripheral end face 4*a*, the bonding portions can be closely arranged, so that the semiconductor device can be further reduced in size.

[Embodiment 3]

Figure 7A:
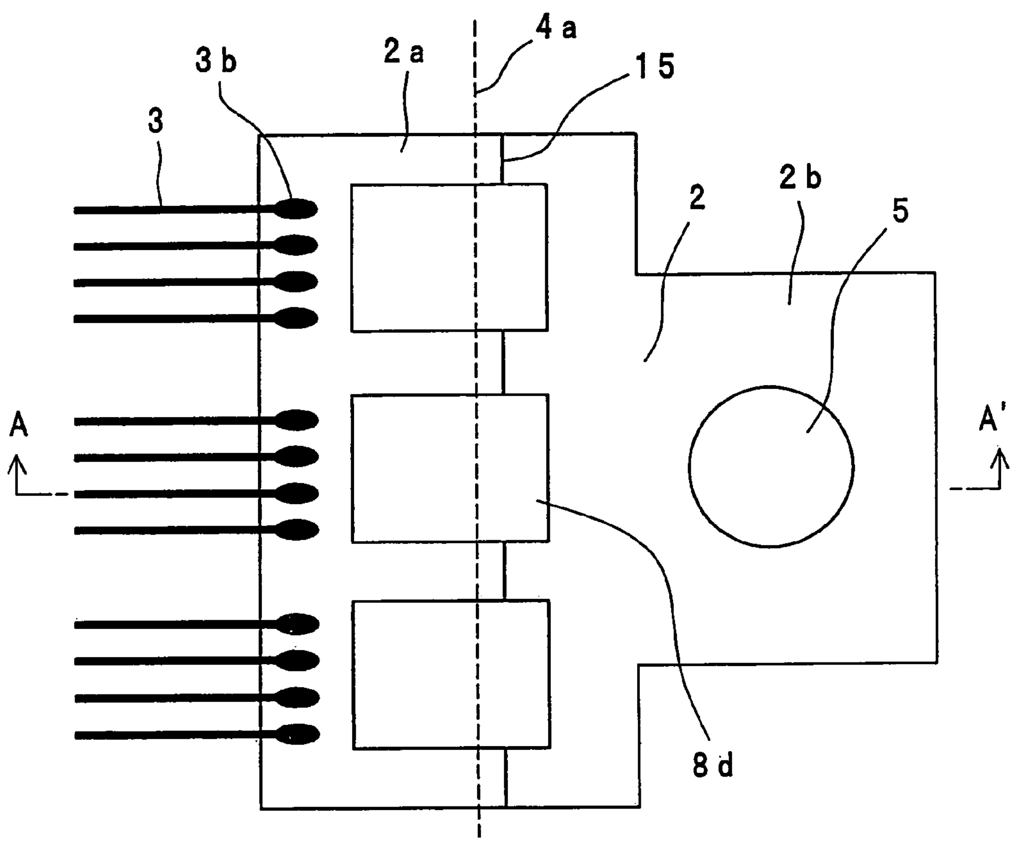
FIG. 7A is a top view showing an inner lead part of an electric power semiconductor device according to an embodiment 3 of the present invention.
Figure 7B:
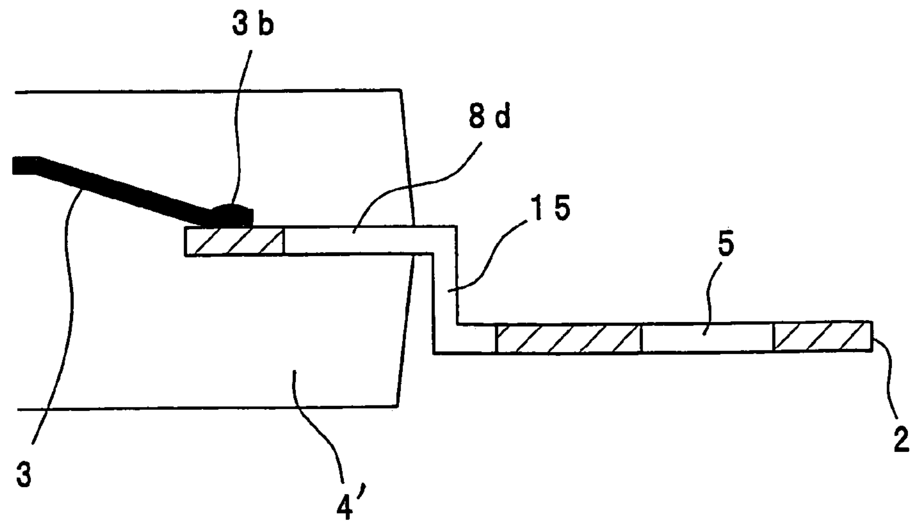
FIG. 7B is a sectional view taken along a line A–A' in FIG. 7A.

The following describes an electric power semiconductor device according to an embodiment 3 of the present invention with reference to FIGS. 7A and 7B. FIG. 7A is a partially perspective top view showing the inner lead of the electric power semiconductor device while seeing through a part of the mold resin 4. FIG. 7B is a sectional view taken along a line A–A' shown in FIG. 7A.

In this embodiment, a part of each through hole 8*d* provided in the main terminal 2 extends to the outside from the outer peripheral end face 4*a* of the mold resin 4. Thus, a part of the through hole is formed so as to be exposed to the outside from the side surface of the mold resin, and therefore an area of a moisture absorption path from the outside can be reduced to improve moisture reliability.

Preferably, as shown in FIG. 7A, a stepped bent portion 15 is formed as a lead bent portion in the main terminal 2 in parallel to the outer peripheral end face 4*a* of the mold resin 4 so as to cross each through hole portion exposed to the outside from the mold resin side face. As shown in FIG. 7B, each of the through holes 8*d* also includes the stepped bent portion 15 in the exposed portion thereof located in the outside of the mold resin end face.

Since the stepped bent portion 15 is formed in the outside in the vicinity of the outer peripheral end face 4*a* of the mold resin 4, when the screw fixing portion 5 of the main terminal 2 acts as a binding portion to apply an external force toward the main terminal, the stepped bent portion 15 of the terminal lead serves as a buffering portion against the external force applied to the main terminal. Thus, heat resistance cycle fatigue and shockproof of the main terminal can be improved.

In addition, since the through hole is extendedly formed so as to be exposed to the outside of the mold resin, a surface area of a moisture permeable path reaching the bonding portion 3*b* from the outside can be reduced and reliability against moisture of a package 4' sealed with the mold resin can be improved.

Furthermore, since the lead bent portion 15 can be formed so as to have a width substantially narrower than a width of the main terminal, a lead bending process can be easily performed and the occurrence of boundary separation between the mold resin and the main terminal due to the lead bending process can be suppressed, and metal mold wear can be prevented from proceeding.

As described above, according to the embodiments 1 to 3 of the present invention, since the through holes 8*a* to 8*d* (represented by reference numeral 8) are formed in the main terminal 2, there can be obtained an effect of restraining a shearing distortion which is generated on the main terminal surface due to mismatching in expansion and contraction amount between the mold resin 4 and the screwed main terminal 2 at the time of the thermal cycle.

Figure 8A:
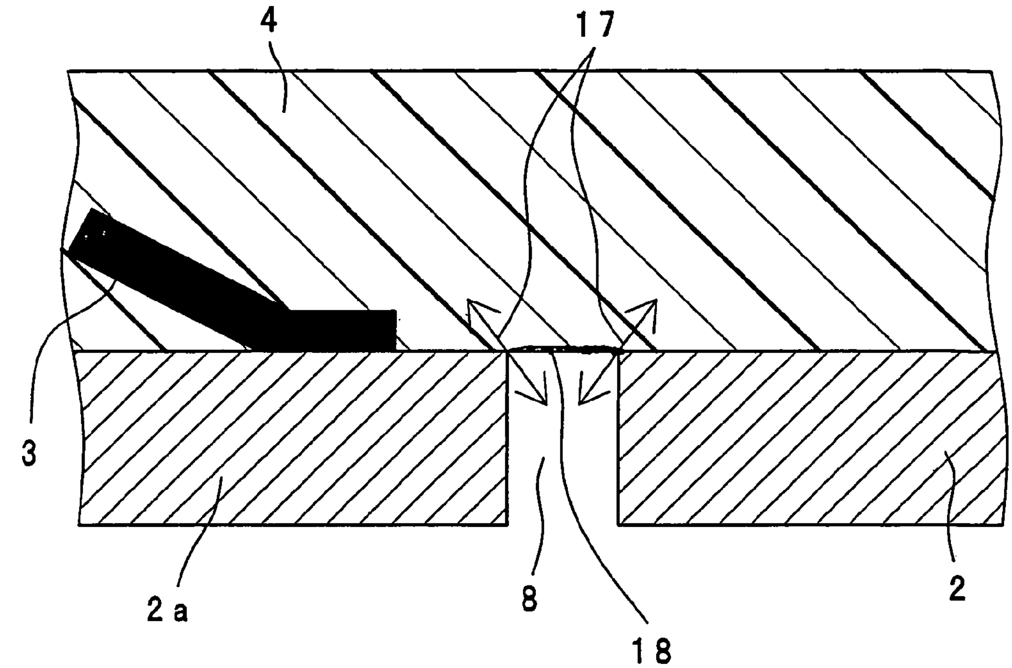
FIG. 8A is an enlarged sectional view showing a vicinity of a through hole according to the present invention.
Figure 8B:
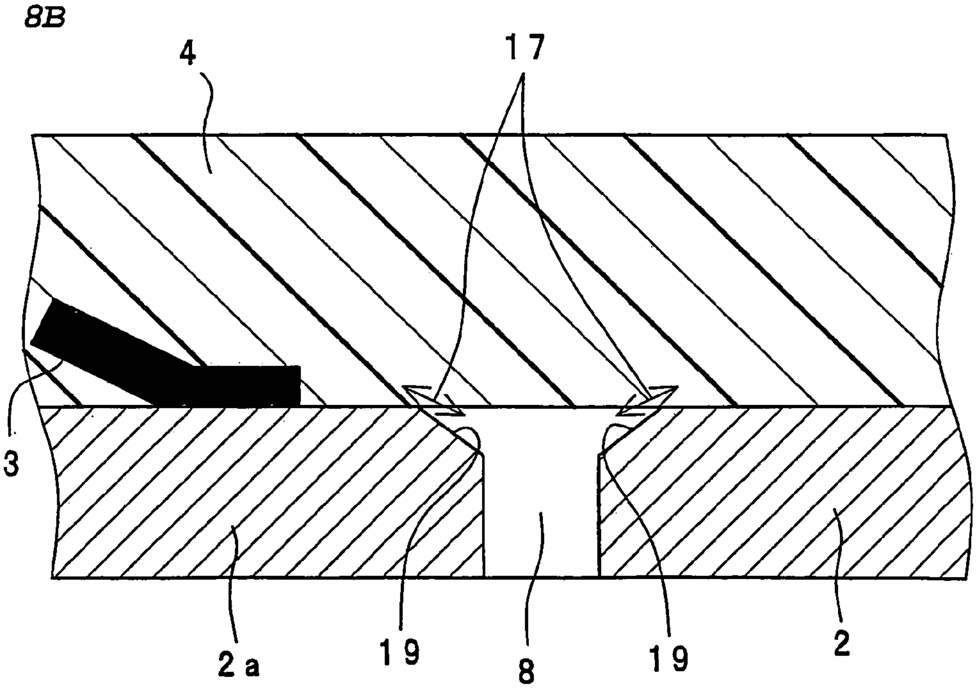
FIG. 8B is an enlarged sectional view showing a modified example of the through hole structure shown in FIG. 8A.

FIGS. 8A and 8B show examples of the sectional constitutions in the vicinity of the through hole 8. In the example as shown in FIG. 8A, a stress 17 concentrates on an upper face periphery of the through hole 8 in the main terminal 2, which is in contact with the mold resin 4. Therefore, in the case where the semiconductor device is subjected to thermal cycles for a long time, a crack 18 may be generated from the outer periphery of the through hole 8 in the surface direction of the main terminal. As shown in FIG. 8A, when the crack 18 penetrates the through hole 8 and proceeds, the restraint of the separation proceeding by the through hole is lost. As a result, similar to the conventional constitution in which there is no through hole formed, the boundary separation may increasingly proceed in the interface between the mold resin 4 and the main terminal 2.

Meanwhile, in an improved example shown in FIG. 8B in which the constitution of the through hole 8 shown in FIG. 8A is improved, a tapered portion 19 is formed at the upper face of the outer periphery of the through hole 8, in the same direction as the wiring lines of the bonding wires 3 on the main face side of the main terminal 2.

Thus, the stress 17 generated in the through hole structure shown in FIG. 8A can be prevented from concentrating on the upper face periphery of the through hole 8, and the crack 18 can be effectively prevented from being generated, which is extremely effective for the electric power semiconductor device which needs still higher reliability.

As described above, according to the present invention, the plural through holes penetrating the main terminal are provided in the outer vicinity of the wire bonding portions formed on the main face of the main terminal within the outer peripheral end face of the mold resin coating the main terminal, and the through holes are aligned along the arrangement direction of the wire bonding portions.

Thus, even when the separation of the mold resin is generated in the separation region (13*b*) from the mold resin outer peripheral end face toward the inner side of the main terminal, the separation is prevented from proceeding by the through hole 8*a*.

As a result, generation of the separation and fracture of the bonding wire can be surely prevented in the region where the wire bonding portions 3*b* are formed and its vicinity. In addition, since the necessary areas of the main terminal portions between the respective adjacent through holes may be limited to the minimum, the electric power semiconductor device can be miniaturized.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. An electric power semiconductor device comprising:

a semiconductor element mounted on a die pad;

a main terminal lead electrically connected to the semiconductor element by a plurality of bonding wires, each of the bonding wires being connected to a continuous surface area on the main terminal lead by a corresponding wire bonding portion so that there are an equal number of bonding wires and wire bonding portions; and a mold resin configured to seal at least the semiconductor element, bonding wires, and the wire bonding portions, thereby forming a package thereof, wherein the main terminal lead is configured as a single body comprised of inner lead portion at an inner end of the single body and an outer lead portion at an outer end of the single body, the inner lead portion further containing a number of through holes, each through hole being configured to penetrate through the main terminal lead at a position between the wire bonding portions and a connection portion of the outer lead portion exposed from the mold resin to the outside for electrical connection, the through holes being less in number than the number of wire bonding portions, and the through holes being arranged to be overlapping with the wire bonding portions as viewed along a main terminal lead direction extending from the inner end through the wire bonding portions and the through holes.

2. The electric power semiconductor device according to claim 1, wherein the through holes are formed in plural rows as viewed in a direction perpendicular to the main terminal lead direction, with the through holes in each row not being in complete alignment as viewed along the main terminal lead direction.

3. The electric power semiconductor device according to claim 1, wherein the through holes are formed in a middle portion of the main terminal lead between the wire bonding portions and an outer peripheral end face of the mold resin.

4. The electric power semiconductor device according to claim 1, wherein a part of each of the through holes is exposed from the outer peripheral end face of the mold resin to the outside.

5. The electric power semiconductor device according to claim 4, wherein the main terminal lead has a stepped bent portion across the exposed through hole portions.

6. The electric power semiconductor device according to claim 1, wherein an opening end of each of the through holes in the surface of the main terminal lead is tapered from a wider opening dimension to a narrower opening dimension as viewed along the main terminal lead direction.

7. The electric power semiconductor device according to claim 1, wherein each of the through holes has a trapezoidal configuration.

8. The electric power semiconductor device according to claim 1, wherein each of the through holes contains no mold resin.

9. The electric power semiconductor device according to claim 1, wherein the bonding wires are arranged in parallel.

10. The electric power semiconductor device according to claim 1, wherein the through holes are arranged in a single row as viewed in a direction perpendicular to the main terminal lead direction.

* * * * *